(12) United States Patent
Flachowsky et al.

(10) Patent No.: US 8,753,969 B2
(45) Date of Patent: Jun. 17, 2014

(54) METHODS FOR FABRICATING MOS DEVICES WITH STRESS MEMORIZATION

(75) Inventors: Stefan Flachowsky, Dresden (DE); Ralf Illgen, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/343,513

(22) Filed: Jan. 27, 2012

(65) Prior Publication Data

US 2013/0196495 A1  Aug. 1, 2013

(51) Int. Cl.
*H01L 21/3205* (2006.01)
*H01L 21/302* (2006.01)
*H01L 21/461* (2006.01)
*H01L 21/31* (2006.01)
*H01L 21/469* (2006.01)

(52) U.S. Cl.
USPC ........... 438/595; 438/585; 438/704; 438/745; 438/749; 438/757; 438/783

(58) Field of Classification Search
USPC .................................. 438/585, 783
See application file for complete search history.

(56) References Cited

U.S. PATENT DOCUMENTS

| | | | |
|---|---|---|---|
| 8,076,209 B2 * | 12/2011 | Yang et al. | 438/299 |
| 2005/0026379 A1 * | 2/2005 | Kammler et al. | 438/303 |
| 2007/0037343 A1 * | 2/2007 | Colombo et al. | 438/231 |
| 2007/0141775 A1 * | 6/2007 | Teo et al. | 438/231 |
| 2008/0090412 A1 * | 4/2008 | Dyer et al. | 438/655 |
| 2009/0230427 A1 * | 9/2009 | Dyer et al. | 257/190 |
| 2009/0294866 A1 * | 12/2009 | Eller et al. | 257/369 |

* cited by examiner

*Primary Examiner* — Michael Jung
*Assistant Examiner* — Jay C Chang
(74) *Attorney, Agent, or Firm* — Ingrassia Fisher & Lorenz, P.C.

(57) ABSTRACT

A MOS device and methods for its fabrication are provided. In one embodiment the MOS device is fabricated on and within a semiconductor substrate. The method includes forming a gate structure having a top and sidewalls and having a gate insulator overlying the semiconductor substrate, a gate electrode overlying the gate insulator, and a cap overlying the gate electrode. An oxide liner is deposited over the top and sidewalls of the gate structure. In the method, the cap is etched from the gate structure and oxide needles extending upward from the gate structure are exposed. A stress-inducing layer is deposited over the oxide needles and gate structure and the semiconductor substrate is annealed. Then, the stress-inducing liner is removed.

7 Claims, 4 Drawing Sheets

US 8,753,969 B2

METHODS FOR FABRICATING MOS DEVICES WITH STRESS MEMORIZATION

TECHNICAL FIELD

The present disclosure generally relates to MOS devices and to methods for their fabrication, and more particularly relates to methods for fabricating MOS devices with stress memorization.

BACKGROUND

The majority of present day integrated circuits (ICs) are implemented by using a plurality of interconnected field effect transistors (FETs), which are also called metal oxide semiconductor field effect transistors (MOSFETs), or simply MOS devices or transistors. A MOS device includes a gate electrode as a control electrode and spaced apart source and drain electrodes between which a current can flow. A control voltage applied to the gate electrode controls the flow of current through a channel between the source and drain electrodes.

The complexity of ICs and the number of devices incorporated in ICs are continually increasing. As the number of devices in an IC increases, the size of individual devices decreases. Device size in an IC is usually noted by the minimum feature size, that is, the minimum line width or the minimum spacing that is allowed by the circuit design rules. As the semiconductor industry moves to smaller minimum feature sizes, the performance of individual devices degrades as the result of scaling. As new generations of integrated circuits and the transistors that are used to implement those integrated circuits are designed, technologists must rely heavily on non-conventional elements to boost device performance.

The performance of a MOS transistor, as measured by its current carrying capability, is proportional to the mobility of the majority carrier in the transistor channel. It is known that applying a longitudinal stress to the channel of a MOS transistor can increase the mobility; a compressive longitudinal stress enhances the mobility of majority carrier holes and a tensile longitudinal stress enhances the mobility of majority carrier electrons. It is further known that stress memorization techniques can be used to increase mobility. Specifically, structures can be used during the MOS device fabrication to impose stresses that remain, at least partially, after the structures are removed. While the use of stress memorization techniques are known, improved stress memorization techniques are desired.

Accordingly, it is desirable to optimize methods for fabricating MOS devices. In addition, it is desirable to provide an optimized method for fabricating MOS devices with a stress memorization technique that enhances stress memorization over conventional MOS device fabrication. Furthermore, other desirable features and characteristics will become apparent from the subsequent detailed description and the appended claims, taken in conjunction with the accompanying drawings and the foregoing technical field and background.

BRIEF SUMMARY

Methods are provided for fabricating a MOS device. In accordance with one embodiment, the MOS device is fabricated on and within a semiconductor substrate. The method includes forming a gate structure having a top and sidewalls and including a gate insulator overlying the semiconductor substrate, a gate electrode overlying the gate insulator, and a cap overlying the gate electrode. An oxide liner is deposited over the top and sidewalls of the gate structure. In the method, the cap is etched from the gate structure and oxide needles extending upward from the gate structure are exposed. A stress-inducing layer is deposited over the oxide needles and gate structure, and the semiconductor substrate is annealed. Then, the stress-inducing layer is removed.

In accordance with another embodiment, a method is provided for fabricating a MOS device on and within a semiconductor substrate. In the method, a gate structure is formed overlying the semiconductor substrate and includes a cap having a top and sidewalls. A liner is deposited over the gate structure, and a selected portion of the liner abuts the sidewalls of the cap. The method provides for etching the cap and exposing needles formed by the selected portion of the liner. Further, a stress-inducing layer is deposited over the needles and the remaining gate structure. The semiconductor substrate is annealed and the stress-inducing layer is removed.

In another embodiment, a method is provided for fabricating a MOS device on and within a semiconductor substrate. In the method, a gate structure is formed with sidewalls and overlies the semiconductor substrate. The sidewalls are lined with a liner that includes needles extending upward from the sidewalls above the gate structure. Further, a stress-inducing layer is deposited over the needles and the gate structure. In the method, the semiconductor substrate is annealed, and the stress-inducing layer is removed.

BRIEF DESCRIPTION OF THE DRAWINGS

The MOS device and methods of fabrication will hereinafter be described in conjunction with the following drawing figures, wherein like numerals denote like elements, and wherein.

DETAILED DESCRIPTION

The following detailed description is merely exemplary in nature and is not intended to limit the MOS device, or the fabrication methods, applications or uses of the MOS device. Furthermore, there is no intention to be bound by any expressed or implied theory presented in the preceding technical field, background or brief summary, or in the following detailed description.

It is known that stress memorization techniques can be used to increase the mobility of majority carriers in a MOS device by depositing a stress-inducing layer over the MOS device's gate structure and annealing to impose stresses. Herein, it is further contemplated that modifying the topography of the gate structure can enhance the memorization of stress in the gate structure, and further increase the mobility of majority carriers in the MOS device.

In accordance with the various embodiments herein, methods for fabricating a MOS transistor device utilize an enhanced stress memorization technique to improve transistor performance. FIGS. 1-7 illustrate, in cross section, a CMOS semiconductor device and method steps for fabricating such a CMOS semiconductor device in accordance with various embodiments herein. As described in greater detail below, the fabricated CMOS semiconductor device includes topographical modifications to its gate structure to enhance effects of a stress memorization technique in order to increase mobility of carriers in the channel regions of both N-type and P-type transistor devices. Although the subject matter is described herein in the context of a CMOS semiconductor device, the subject matter is not intended to be limited to CMOS semiconductor devices, and may be utilized with other MOS semiconductor devices which are not CMOS semiconductor devices. Additionally, although the term "MOS device" properly refers to a device having a metal gate electrode and an oxide gate insulator, that term will be used herein to refer to any semiconductor device that includes a conductive gate electrode (whether metal of other conductive material) that is positioned over a gate insulator (whether oxide or other insulator) which, in turn, is positioned over a semiconductor substrate. Various steps in the fabrication of MOS semiconductor devices are well known and so, in the interest of brevity, many conventional steps will only be mentioned briefly herein or will be omitted entirely without providing the well known process details.

Figure 1:
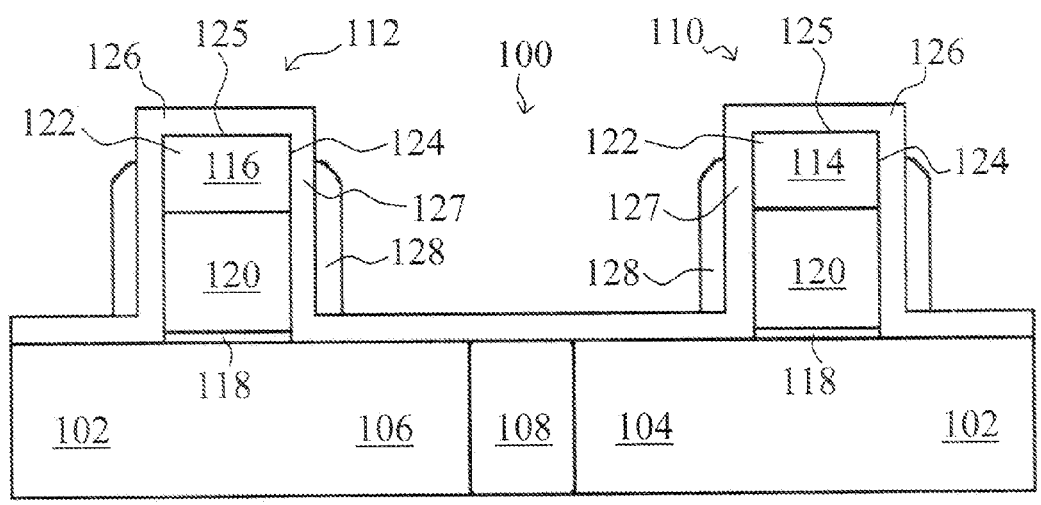
FIGS. 1-7 illustrate, in cross section, a MOS device and method steps for its fabrication in accordance with various embodiments herein.

Turning now to FIG. 1, in an exemplary embodiment, the fabrication process begins by forming gate structures 110, 112 having gate caps 114, 116, such as silicon nitride gate caps, overlying isolated regions 104, 106 of semiconductor material 102. The isolated regions 104, 106 are preferably formed from a substrate (or wafer) of semiconductor material 102 (e.g., a silicon-on-insulator (SOI) substrate or a bulk silicon substrate). The semiconductor material 102 is preferably a silicon material, wherein the term "silicon material" is used herein to encompass the relatively pure silicon materials typically used in the semiconductor industry as well as silicon admixed with other elements. Alternatively, the semiconductor material 102 can be realized as germanium, gallium arsenide, and the like, or the semiconductor material 102 can include layers of different semiconductor materials. For convenience, but without limitation, the semiconductor material 102 may hereinafter be referred to as a silicon material. The regions 104, 106 are electrically isolated from neighboring regions of the substrate by performing shallow trench isolation (STI) or another isolation process to form an insulating material 108, such as silicon dioxide, in between the regions 104, 106 of the silicon material 102. For convenience, but without limitation, the insulating material 108 may hereinafter be referred to as the field oxide.

Prior to forming gate structures 110, 112, the isolated regions 104, 106 are doped in a conventional manner to achieve a desired dopant profile for the body regions (or well regions) of the subsequently formed transistor structures. For example, an N-type region 106 of semiconductor material 102 may be formed by masking region 104 and implanting N-type ions, such as phosphorous or arsenic ions, into region 106. In this regard, the N-type region 106 functions as an N-well for a PMOS transistor structure subsequently formed on region 106. In a similar manner, the N-type region 106 is masked and a P-well for a subsequently formed NMOS transistor structure is formed in region 104 by implanting P-type ions, such as boron ions, into region 104. For convenience, the N-type (or N-well) region 106 may alternatively be referred to herein as the PMOS transistor region and the P-type (or P-well) region 104 may alternatively be referred to herein as the NMOS transistor region.

After doping the isolated regions 104, 106, the fabrication process continues by forming the gate structures 110, 112 overlying the isolated regions 104, 106. The gate structures 110, 112 function as gate electrodes for the MOS transistor structures subsequently formed on the regions 104, 106 of silicon material 102 and the gate structures 110, 112 can be created using a conventional gate stack module or any combination of well-known process steps. As illustrated in FIG. 1, the gate structures 110, 112 preferably include at least one layer of insulating dielectric material 118 and at least one layer of conductive gate electrode material 120. For example, the gate structure 110, 112 may be formed by growing or depositing one or more layers of dielectric material 118, such as an oxide material or a high-k dielectric material, overlying the silicon material 102. After forming the gate dielectric material 118, fabrication of gate structures 110, 112 continues by depositing one or more layers of conductive gate electrode material 120, such as a metal material or polycrystalline silicon (polysilicon), overlying the layer(s) of dielectric material 118. It should be understood that various numbers, combinations and/or arrangements of materials may be utilized for the gate structure in a practical embodiment, and the subject matter described herein is not limited to any particular number, combination, or arrangement of gate material(s) in the gate structure. In an exemplary embodiment, the uppermost portion of the gate electrode material 120 is realized as polysilicon to facilitate formation of silicide contact regions on the upper surfaces of the gate structures 110, 112, as described below in the context of FIG. 7.

In the illustrated embodiment, after forming the gate electrode material 120, fabrication of the semiconductor device structure 100 continues by depositing a layer of capping material 122 overlying the conductive gate electrode material 120. In an exemplary embodiment, a layer of silicon nitride 122 is conformably deposited overlying the conductive material to a thickness in the range of about 3 nm to about 5 nm by plasma enhanced chemical vapor deposition (PECVD). After the capping material 122 is formed, portions of the dielectric material 118, conductive gate electrode material 120, and capping material 122 are then selectively removed using an anisotropic etchant and a corresponding etch mask to define gate structures 110, 112 with sidewalls 124 substantially perpendicular to (or orthogonal to) the surface of the silicon material 102 and to the tops 125 of the gate structures.

In FIG. 1, an oxide liner 126 is deposited over the semiconductor substrate 102, STI 108, and gate structures 110, 112. In an exemplary embodiment, the oxide liner 126 is $SiO_2$, has a thickness of about 2 to about 6 nm, and is deposited by chemical vapor deposition (CVD) or low pressure tetraethylorthosilicate (LP-TEOS) process. As shown, the oxide liner 126 abuts the sidewalls 124 and tops 125 of the gate structures, with portions 127 of the oxide liner 126 abutting the sidewalls 124 formed by the caps 114, 116. Thereafter, a spacer-forming material, such as silicon nitride, is deposited over the oxide liner 126 and then is anisotropically etched to form spacers 128. In an embodiment, source and drain extension regions and halo regions are thereafter formed within the isolated regions 104, 106 of silicon material 102. For example, P-type source and drain extension regions may be formed in the N-well region 106 by masking the NMOS transistor region 104 (e.g., using photoresist or another masking material) and implanting P-type ions, such as boron ions, into the exposed silicon material 102 of the PMOS transistor region 106 to a desired depth and/or sheet resistivity using the gate structure 112 and/or gate cap 116 as an implantation mask. Also, while the NMOS transistor region 104 is masked, N-type halo regions are formed in the channel region underlying the gate structure 112 by implanting N-type ions, such as phosphorous ions or arsenic ions, at an angle to the surface of the silicon material 102 using the gate structure 112 and/or gate cap 116 as an implantation mask.

In accordance with one embodiment, prior to activating the dopant ions of the P-type source/drain extensions and the N-type halo regions, the NMOS transistor region 104 is unmasked while the PMOS transistor region 106 is masked and N-type source/drain extension regions and P-type halo regions are formed in the P-well region 104. In a similar manner as described above, the N-type extension regions are formed by implanting N-type ions, such as phosphorous or arsenic ions, into the exposed silicon material 102 of the NMOS transistor region 104 and the P-type halo regions are formed by implanting P-type ions, such as boron ions, at an angle to the surface of the silicon material 102 using the gate structure 110 and/or gate cap 114 as an implantation mask. In an embodiment, after the N-type source/drain extensions and P-type halo regions are formed in the P-well region 104, the PMOS transistor region 106 is unmasked.

In accordance with one embodiment, after forming the source/drain extensions and halo regions in both transistor regions 104, 106, a diffusionless annealing (or ultrafast annealing (UFA)) is performed for a high degree of dopant activation as well as to re-crystallize the substrate silicon material 102 and remedy any lattice defects that may be caused by the ion implantation process steps without causing diffusion of the implanted dopant ions. In this regard, the semiconductor device structure 100 is heated (e.g., by performing a flash anneal or a laser anneal) for an amount of time that is less than a threshold amount of time that would otherwise result in the diffusion of the dopant ions in the source/drain extensions and/or halo regions. In an exemplary embodiment, the semiconductor device structure 100 is heated to a temperature of about 1250° C. or more for about 10 milliseconds or less to inhibit diffusion of dopant ions in the source/drain extensions and/or halo regions or otherwise ensure that any diffusion of dopant ions in the source/drain extensions and/or halo regions is negligible. The relatively high temperature of the diffusionless anneal activates the dopant ions of the source/drain extensions and/or halo regions but the duration of the diffusionless anneal is such that any lateral diffusion of the dopant ions is inhibited or otherwise prevented. It should be noted that due to the diffusionless annealing processes described herein, in exemplary embodiments, the source/drain extensions are formed by ion implantation using only the gate structures and/or gate caps as ion implantation masks and without the use of any offset spacer(s) to define the lateral extent of the source/drain extension regions.

Figure 2:
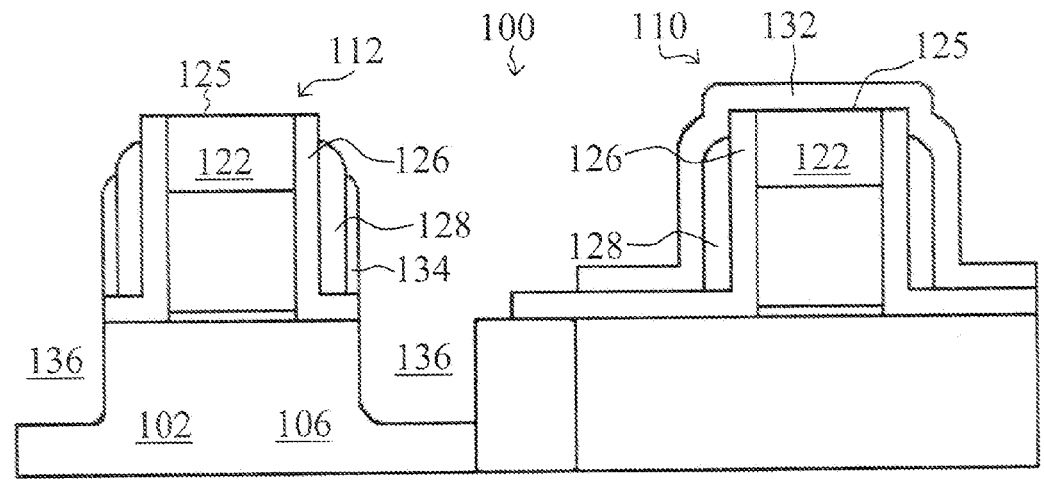

Referring now to FIG. 2, in an exemplary embodiment, fabrication of the semiconductor device structure 100 continues by removing the thin oxide liner 126 from the tops 125 of the gate structures 110, 112. Typically, the removal of the thin oxide liner 126 is performed by anisotropic etch. Then, a masking layer, such as silicon nitride, is deposited over the remaining oxide liner 126, spacers 128, and caps 122. The masking layer is lithographically etched to form a hardmask 132 over gate structure 110 and to form spacers 134, while exposing the semiconductor material 102 in isolated region 106. Then, the semiconductor material 102 in isolated region 106 is anisotropically etched to form u-shaped recesses 136.

Figure 3:
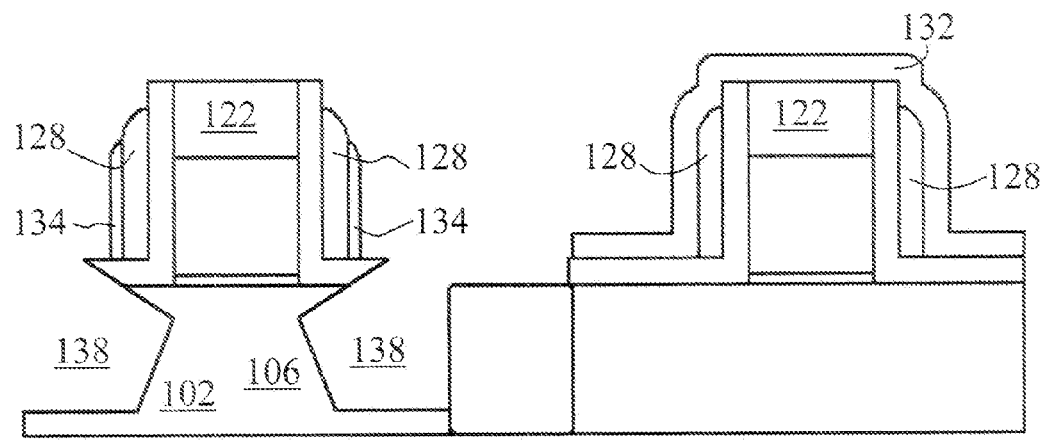
Figure 4:
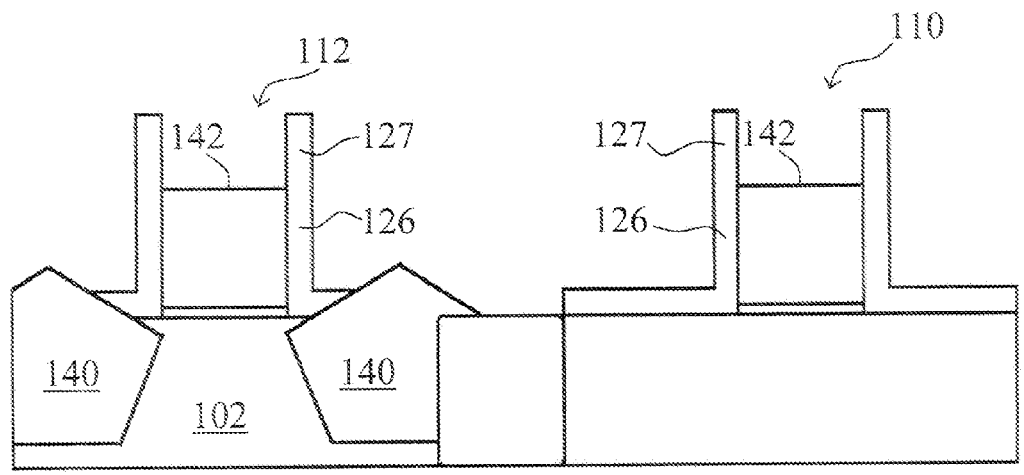

In FIG. 3, a tetramethylammonium hydroxide (TMAH) etch is used to form sigma-shaped recesses 138 in the semiconductor material 102 in isolated region 106. As shown in FIG. 4, in-situ doped SiGe 140 is selectively epitaxially grown in the sigma-shaped recess. Then, all silicon nitride is removed from the gate structures 110, 112, preferably with a highly selective etch. For example, a hot phosphorus acid wet etch may be used to remove the caps 122, spacers 128, spacers 134, and hardmask 132. The hot phosphorus etch is monitored closely so that it may be stopped as soon as all nitride is removed. Therefore, the underlying oxide is not attacked by the hot phosphorus etch. As a result of the removal of the nitride, the portions 127 of the oxide liner 126 previously abutting the caps 122 are fully exposed and extend vertically as needles above the remaining gate structure 142. As shown, the oxide needles have a height substantially equal to the thickness of the caps 122.

Figure 5:
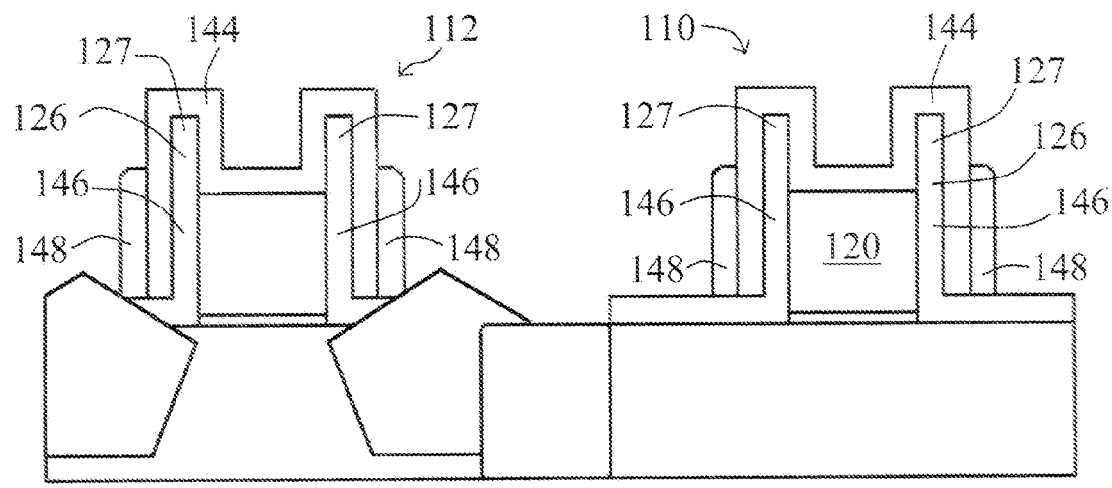

In FIG. 5, in accordance with an exemplary embodiment, an additional layer of oxide liner 144 is deposited across the gate structures 110, 112 and overlies the needle portions 127 and the other vertical portions 146 of the oxide liner 126 abutting the gate electrode material 120 in the gate structures 110, 112. In an exemplary embodiment, liner 144 is SiO2, has a thickness of about 5 to about 10 nm, and is deposited by chemical vapor deposition (CVD) or low pressure tetraethylorthosilicate (LP-TEOS) process. Then a spacer-forming material, such as silicon nitride, is deposited and etched to form spacers 148. Source/drain implants may then be performed in a process similar to the implant process described above in relation to the source/drain extensions and halo implants.

Figure 6:
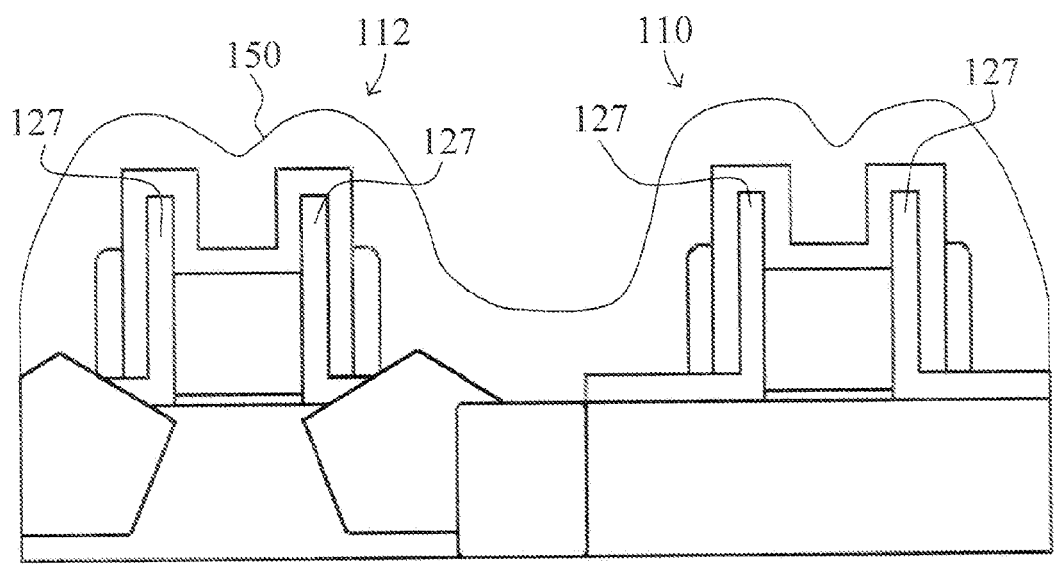

In accordance with one embodiment, as illustrated in FIG. 6, one or more layers of a stress memorization technique (SMT) stress-inducing material 150 are deposited over the gate structures 110, 112. As shown, the stress-inducing material 150 overlies the oxide needles 127 and is positioned in the recess formed between the needles. In certain embodiments, the SMT stress-inducing material 150 can include an etch stop oxide liner deposited underneath a blanket-deposited nitride layer. An anneal process such as a rapid thermal anneal at about 1050° C. is then performed for about 1 to about 2 seconds. The anneal process causes expansion of at least one layer of the stress-inducing material 150. Because thermal expansion coefficients are different between oxide, silicon and nitride materials, stresses in the materials are created and are memorized. The expansion forces are magnified by the needles 127 to generate increased stress within the gate structures 110, 112. Specifically, in conventional methods, the stress-inducing material exerts direct forces on the top surface of the gate electrode material; however, in the embodiments herein, the stress-inducing material is able to exert forces on the additional surface area provided by the needles 127, and on the increased surface area provided by the additional oxide liner 144. Further, the needles 127 are believed to act as mechanical levers, increasing the stresses delivered in the gate structure.

Figure 7:
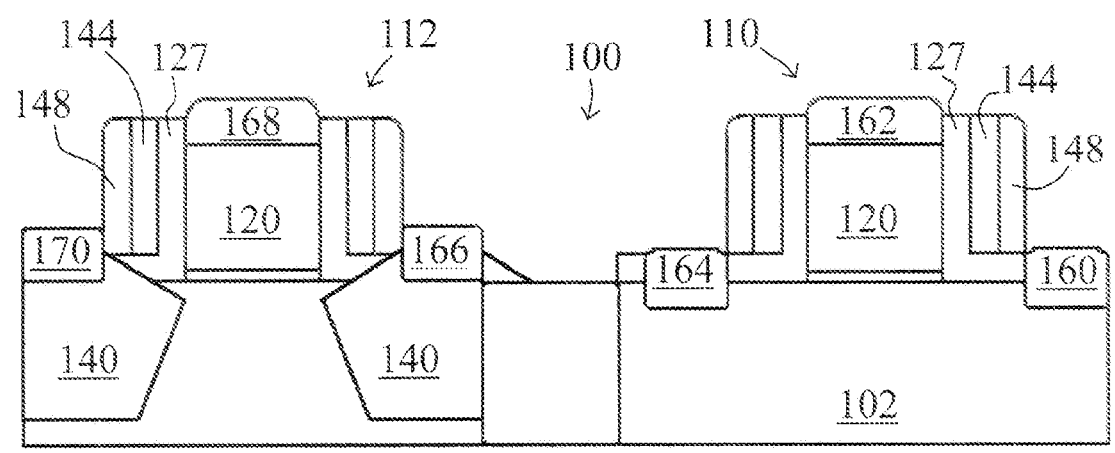

As shown in FIG. 7, the stress-inducing material 150 may be removed, such as by a hot phosphorus acid wet etch. Then the needles 127, additional oxide liner 144, and spacers 148 are planarized to be level with the surface of the gate electrode material 120 before fabrication of the semiconductor device structure 100 continues by forming contact regions 160, 162, 164, 166, 168, 170. In an exemplary embodiment, the contact regions 160, 162, 164, 166, 168, 170 are formed by depositing a layer of silicide-forming metal onto the surfaces of the SiGe 140, gate electrode material 120, and semiconductor material 102. The silicide-forming metal may be realized as, for example, nickel platinum, cobalt, nickel, rhenium, ruthenium, or palladium, or alloys thereof. In an exemplary embodiment, the silicide-forming metal is deposited (e.g., by sputtering) to a thickness in the range of about 8 nm to about 12 nm. After forming the silicide-forming metal layer, the semiconductor device structure 100 is heated, for example, by performing a rapid thermal anneal (RTA) for about sixty second at 260° C. to cause the silicide-forming metal to react with exposed silicon and form the metal silicide contact regions 160, 162, 164, 166, 168, 170 at the top of each of the source and drain regions as well as on top of the gate structures 110, 112. In this regard, the temperature and duration of the anneal is such that diffusion of dopant ions in the epitaxially-grown materials, source/drain extensions and/or halo regions is inhibited, prevented, or is otherwise negligible. Any silicide-forming metal that is not in contact with exposed silicon does not react during the annealing to form a silicide and may subsequently be removed in a conventional manner (e.g., by wet etching in a $H_2O_2/H_2SO_4$ or $HNO_3/HCl$ solution). After forming the silicide contact regions 160, 162, 164, 166, 168, 170, fabrication of the semiconductor device structure 100 may be completed using well known final process steps (e.g., back end of line (BEOL) process steps), which will not be described in detail herein.

To briefly summarize, the fabrication methods described herein utilize a mechanical magnification of the stress forces imparted by the stress-inducing material 150 through the needles 127 (and additional oxide liner 144) to increase stress within the gate structures 110, 112. Thus, the increased stress memorization in the gate structures 110, 112 results in enhanced carrier mobility and drive currents.

The foregoing embodiments have been of methods for fabricating stress enhanced transistor devices. Similar methods can be used to fabricate stress enhanced PMOS or NMOS transistors, and the fabrication of either structure or both structures can be integrated into methods for fabricating CMOS integrated circuits including both stressed and unstressed PMOS and NMOS transistors.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application

What is claimed is:

1. A method for fabricating a MOS device on and within a semiconductor substrate comprising:

forming a gate structure including a cap having a top and sidewalls overlying a top of a gate electrode, wherein the gate structure overlies the semiconductor substrate;

depositing a liner over the gate structure, wherein a selected portion of the liner abuts each sidewall of the cap;

forming first spacers adjacent the selected portion of the liner;

simultaneously etching the cap and the first spacers and simultaneously exposing interior surfaces and exterior surfaces of needles formed by the selected portion of the liner, wherein the interior surface of each needle faces the other oxide needle and each exterior surface is opposite a respective interior surface;

depositing an additional liner on the exposed interior surfaces and exposed exterior surfaces of the needles and over the top of the gate electrode;

forming a second spacer adjacent each exterior surface of the needle;

depositing a stress-inducing layer over the additional liner, wherein depositing the stress-inducing layer includes depositing the stress-inducing layer over the second spacers such that the second spacers are interposed between the stress-inducing layer and the exterior surfaces of the needle;

annealing the semiconductor substrate and expanding the stress-inducing material outwardly into the needles; and removing the stress-inducing layer.

2. The method of claim 1 wherein depositing the liner over the gate structure comprises depositing an oxide liner over the gate structure.

3. The method of claim 2 wherein forming the gate structure includes depositing silicon nitride to form the cap and wherein forming first spacers includes depositing silicon nitride to form the first spacers.

4. The method of claim 3 wherein etching the cap and first spacers comprises wet etching the cap and spacers with phosphoric acid.

5. The method of claim 1 further comprising removing the liner from the top of the cap before etching the cap.

6. The method of claim 1 wherein depositing an additional liner on the exposed interior surfaces and exposed exterior surfaces of the needles and over the top of the gate electrode comprises forming the additional liner with outer surfaces parallel to the exterior surfaces of the needles and with inner surfaces parallel to the interior surfaces of the oxide line; and wherein depositing a stress-inducing layer over the additional liner comprises depositing a stress-inducing layer on to the outer surfaces and the inner surfaces of the additional liner.

7. The method of claim 1 further comprising depositing an etch stop liner over the needles and the remaining gate structure before depositing the stress-inducing layer.

* * * * *